United States Patent
Flach et al.

(10) Patent No.: US 7,221,617 B2
(45) Date of Patent: May 22, 2007

(54) BACKWARDS-COMPATIBLE MEMORY MODULE

(75) Inventors: Bjorn Flach, Munich (DE); Monica De Castro Martins, Munich (DE); Wolfgang Ruf, Friedberg (DE); Martin Schnell, Munich (DE)

(73) Assignee: Infineon Technologies AG, Munich (DE)

( * ) Notice: Subject to any disclaimer, the term of this patent is extended or adjusted under 35 U.S.C. 154(b) by 46 days.

(21) Appl. No.: 11/127,536

(22) Filed: May 12, 2005

(65) Prior Publication Data

US 2005/0270891 A1 Dec. 8, 2005

(30) Foreign Application Priority Data

Jun. 2, 2004 (DE) .................... 10 2004 026 808

(51) Int. Cl.
*G11C 8/00* (2006.01)
(52) U.S. Cl. ............. 365/233; 365/189.05; 365/230.03
(58) Field of Classification Search ............... 365/233, 365/189.05, 230.03
See application file for complete search history.

(56) References Cited

U.S. PATENT DOCUMENTS 6,240,047 B1    5/2001    Koelling et al.
6,728,163 B2 *  4/2004    Gomm et al. ............... 365/233
6,728,839 B1 *  4/2004    Marshall ..................... 711/137
6,914,851 B1 *  7/2005    Kiehl .......................... 365/233

FOREIGN PATENT DOCUMENTS

JP      41 15 127 A1    1/1992

OTHER PUBLICATIONS

German Office Action dated Mar. 22, 2005.

* cited by examiner

*Primary Examiner*—Huan Hoang
(74) *Attorney, Agent, or Firm*—Jenkins, Wilson, Taylor & Hunt, P.A.

(57) ABSTRACT

A backwards-compatible memory module is disclosed. According to one aspect, a memory module comprises addressable memory cells organized in organization units having a predetermined number of memory cells, a read/write control device clocked by a first clock signal, a plurality of prefetch registers for initially storing data read from the memory cells wherein the register size corresponds to the predetermined number. In a first operating mode, a switching device clocked by a second clock signal successively couples the prefetch registers to data input/output terminals. The number of data input/output terminals corresponds to the predetermined number. In a second operating mode, the switching device is controlled by at least one address signal and couples at least one of the prefetch registers to the data input/output terminals.

37 Claims, 4 Drawing Sheets

BACKWARDS-COMPATIBLE MEMORY MODULE

TECHNICAL FIELD

The present invention relates to a backwards-compatible memory module, in particular for use as an SDR, DDR1, DDR2 and/or DDR3 SDRAM module.

BACKGROUND ART

The increasing speed of computer processors requires, in a corresponding manner, a higher speed for memory accesses and faster memory modules, in particular for RAMs (random access memories).

Thus, in the past, various generations of RAMs have been developed whose access rate has risen continuously. The important factor is in each case to shorten the time intervals with which new data to be read from or written to the memory cell array is produced at the data inputs/outputs of the corresponding memory module. Starting from synchronous dynamic RAMs (SDRAM), so-called DDR SDRAMs have been developed, with twice the data rate (DDR=double data rate). More recently, the International JEDEC Standardization organization has proposed requirements for more recent generations of DDR2 and DDR3 SDRAMs.

Since the transition from one generation of memory chips to the next is in some cases associated with major changes, for example to the supply voltages, data rate, the form of corresponding control signals, memory modules of a more recent generation cannot be used in computer systems which have been developed for an older generation of memory modules. For example, for this reason, a DDR2 memory module cannot be operated as an SDR memory module (single data rate), because DDR2 provides, inter alia, differential control and clock signals and a 1.8 supply voltage. In contrast, SDR modules were operated with 3.5 volts and single-ended control and clock signals.

Since the life of many computer systems is greater than that of the memory modules that are used, memory manufacturers must therefore in general also stock and/or produce older generations of memory modules. This means that production capacities can be used only inefficiently, since the demand for older generations of memory modules generally decreases over time. The production capacity resources are therefore generally used for mass production of the latest generation of memory modules. However, in order to allow the production capacities to be completely exhausted, it is desirable to design new memory modules such that they can also be used in appliances which were originally developed to accommodate older generations of memory modules.

SUMMARY OF THE INVENTION

One object of the present invention is therefore to provide a backwards-compatible memory module, which complies with the specifications of the latest memory generation and at the same time can be configured and can be used as a memory module for an older generation.

One particular object of the present invention is to provide a DDR2 memory module which can also be used as an SDR and/or DDR1 memory module.

This object is achieved by a memory module having the features of patent claim 1.

Accordingly, a memory module is provided having at least one memory cell array, with the memory cells each being addressable by at least one address and being organized in organization units comprising a predetermined number of memory cells which can be driven jointly and at the same time;

a clocked read/write control device, which is clocked with a first clock signal and which is coupled to the memory cell array, for reading-in data from the memory cells as a function of address signals;

a prefetch register unit, which is coupled to the read/write control device, for initial storage of data which is read from the memory cell array and having two or more prefetch registers, whose respective register size corresponds to the predetermined number of memory cells in the organization units;

a controlled switching device, which is coupled to the prefetch register unit, for outputting the data which is initially stored in the prefetch registers at data inputs/outputs of the memory module, with the switching device successively coupling the prefetch registers to the data inputs/outputs of the memory module in a first operating mode of the memory module, controlled by a second clock signal, with the number of data inputs/outputs corresponding to the number of memory cells in the organization units, and coupling at least one of the prefetch registers to the data inputs/outputs of the memory module in a second operating mode of the memory module controlled by at least one of the address signals.

Essentially, the basic idea according to the invention is to simulate the behavior of different generations of memory modules by suitable connection of the prefetch registers to the data inputs/outputs of the memory module.

One of the major differences between, for example, DDR and SDR SDRAM modules is that, fundamentally, only a single prefetch register is provided in an SDR module, and the data which is read from the memory cell array is in each case output on a falling or a rising clock flank of a clock signal, in this case the first clock signal, to the data inputs/outputs of the memory module. The width of the data bus and the number of data lines between the data pins which form the data inputs/outputs, as well as the read/write control in this case correspond to the organization of the memory cell array.

In the case of DDR memory modules, data is initially stored from the memory cells in the prefetch registers at a first clock rate based on the first clock signal with each prefetch register being chosen to be sufficiently large that the data of one organization unit is in each case held in it. The contents of the prefetch registers are then coupled to the data inputs/outputs of the memory module, by a controlled switching device. In the case of DDR1 memory modules, this is done on each rising and falling clock flank of the second clock signal, which is identical to the first clock signal, and in the case of DDR2, the change takes place on a rising and falling clock flank of the second clock signal, whose internal clock frequency is twice that of the first clock signal.

Thus, in comparison to SDR SDRAM chips, DDR1 achieves twice the data rate, and DDR2 four times the data rate.

The first operating mode is provided in order to allow a corresponding memory module according to the invention to be used as a DDR and SDR memory module, and the second operating mode is provided in order to allow the memory module according to the invention to also be used as, for example, an SDR memory module.

In the second operating mode, the controlled switching device is controlled by one of the address signals, and not by the second clock signal. This means that only the content of one of the prefetch registers is coupled to the data outputs of the memory module. The content of this prefetch register which is passed on then corresponds to the contents of the addressed memory cells in a respective organization unit, which are addressed by the address signals. The contents of the further prefetch registers are then ignored in this operating mode. The switching of the prefetch register according to the invention thus allows the memory module according to the invention to be used as an SDR or DDR memory module, as a function either of the second clock signal or of the address signals.

According to one advantageous development of the memory module, a third operating mode is provided, in which the switching device couples at least a selection of the prefetch registers to the data inputs/outputs of the memory module successively, controlled by at least one of the address signals and by the first clock signal.

This third operating mode makes it possible to switch the memory module between, for example, DDR2 and DDR1.

One major difference between DDR2 memory modules and DDR1 memory modules is the doubling of the number of prefetch registers and, at the same time, the doubling of the second clock signal, which controls the controlled switching device, in the changeover from DDR memory modules of the first generation (DDR1) to the second (DDR2). Thus, in the case of DDR2, the second clock signal will internally be at twice the clock frequency of the first clock signal, which clocks the read/write control device, thus resulting in twice the data rates at the data inputs/outputs and data pins of the corresponding chip, compared to DDR1.

Thus, in order to make it possible to use a correspondingly designed memory module as a DDR1 memory module, the invention provides for only a selection of the prefetch registers to be coupled to the data inputs/outputs, as a function of the address signals. This preferred development thus allows the operation of the memory module according to the invention at least as a DDR1 or DDR2 memory module.

The clock frequency of the second clock signal is preferably an integer multiple of the clock frequency of the first clock signal.

Furthermore, it is advantageous for the first clock signal and the second clock signal to have the same clock frequency. This means that the first operating mode can be carried out as a DDR1 mode, and the second operating mode can be carried out as an SDR mode.

Preferably, the clock signals are differential clock signals, and/or the first clock signal is an externally applied clock signal.

In one preferred embodiment, the controlled switching device changes the respective prefetch register which is coupled to the data inputs/outputs on each zero crossing of the second differential clock signal, in the first operating mode of the memory module. In this preferred embodiment, the memory module can be used as a DDR2 memory module.

In a further preferred embodiment, the controlled switching device changes the respective prefetch register which is connected to the data inputs/outputs on each rising and each falling clock flank of the second clock signal in the first operating mode of the memory module. In this preferred embodiment, the memory module according to the invention can be used as a DDR1 memory module.

In yet another preferred embodiment, the controlled switching device changes the respective prefetch register which is coupled to the data inputs/outputs either only on each rising clock flank or only on each falling clock flank of the second clock signal in the first operating mode of the memory module. This preferred embodiment allows use as an SDR SDRAM module.

In one preferred development of the memory module according to the invention, the memory module has control logic which is coupled at least to the read/write control device and to the switching device, and which controls the burst length of the data which can be tapped off at the data inputs/outputs of the memory module as a function of at least one burst length control signal. The burst length describes the length of data units which are applied to the data bus for a memory access, for example a burst length of 1 for an SDR SDRAM module, that is to say a single bit per organization unit is applied to the data line for a memory access cycle. In order to achieve a greater data flow, the burst length is frequently set to be longer in order to allow as much data as possible to be read from or written to the memory module in one data access.

In one preferred embodiment, the control logic has at least one clock generator for production of a clock signal which is complementary to the first clock signal, and for production of the second clock signal. This has the advantage that a memory module according to the invention which is based on DDR2 SDRAM modules can be used in an appliance environment which is designed for SDR memory modules. Internally, the memory according to the invention produces a differential clock signal from the first clock signal and the complementary clock signal, because differential clock signals are generally used in DDR2 memory modules. This has the advantage that it is possible to use subelements from the DDR2 SDRAM production for the manufacture of a memory chip according to the invention.

In yet another preferred embodiment, the control logic has an address evaluation unit for selection of the address signals for controlling the switching device.

In the second operating mode of the memory module, the switching device preferably couples that prefetch register to the data inputs/outputs of the memory module which contains, in an initially stored form, the data for those memory cells of the respective organization unit which are addressed by an initial address. In this case, the initial address is determined by the address signals.

In the case of DDR memory modules, an initial address addresses a number of memory cells or organization units which follow this initial address. The number of bits of the addressed organization units which are passed successively to the data inputs/outputs in one read cycle then generally depends on the selected burst length.

In yet another preferred embodiment, in the third operating mode, the switching device in each case couples a first prefetch register and further prefetch registers to the data inputs/outputs of the memory module successively on each switching time reference. In this case, the first prefetch register contains the data in an initially stored form for those memory cells in the respective organization unit which are addressed by an initial address, with the initial address being determined by the address signals. Furthermore, in this case, the number of further prefetch registers which are coupled to the data inputs/outputs depends on the burst length.

This switching time reference is advantageously every alternate rising clock flank of the second clock signal, or every alternate falling clock flank of the second clock signal. In the case of differential clock signals, the switching time reference is preferably every alternate zero crossing of the first or second clock signal. Furthermore, it can be advantageous for the switching time reference to be every rising clock flank of the first clock signal.

In one preferred refinement of the memory module according to the invention, in the third operating mode, a read cycle is ended after half the number of prefetch registers have been coupled in a very short burst length. This has the advantage that a memory module according to the invention which is being operated in accordance with DDR2 requirements can be used as a DDR1 module in this third operating mode. In this case, only the first half of the prefetch registers which are provided are used. If the burst lengths are relatively long, this first half of the prefetch registers is then used repeatedly and successively for initial storage and outputting of memory data to the data inputs/outputs, until the appropriate number of data items have been produced at the data inputs/outputs, depending on the selected burst length.

The operating mode and/or the burst length can preferably be set as a function of memory configuration data. This can preferably be defined by means of fuse links in the memory modules, during their manufacture. This has the advantage that the memory module according to the invention can be produced as a memory module of the latest generation, and can, however, also be configured as a memory module for an older generation, for example SDR or DDR1, by storage of the memory configuration data.

In a further preferred embodiment, the memory module has supply voltage connections for application of an external supply voltage, and has voltage regulation which can be switched on for regulation of the external supply voltage and an internal supply voltage for the memory cell array, read/write control device, prefetch register unit, switching device and/or control logic.

Since more recent generation memory modules operate at lower supply voltages—for example 2.5 V is provided for DDR1 and 1.8 V or 1.5 V for DDR2 and DDR3—and since the memory module according to the invention is intended to receive both supply voltages for the older generations, for example SDR, around 3.3 V, this voltage regulation according to the invention allows better compatibility with different generations of memory modules.

The memory module according to the invention can preferably be used as a DDR2 SDRAM module in the first operating mode, can be used as an SDR SDRAM module in the second operating mode, and can be used as a DDR1 SDRAM module in the third operating mode.

A signal converter is advantageously provided in order to produce a differential control signal from an external signal-ended control signal and a reference voltage signal.

One of the signal-ended control signals is preferably a data strobe signal. Since, for example, differential control signals are passed to the memory module in the DDR2 generations of memory modules, and that single-ended control signals are passed to them for older generations, the signal converter according to the invention is used to improve the compatibility with different generations of memory modules.

The prefetch registers are likewise preferably bidirectional registers. This also allows data to be written to the memory cells using the same control and control logic as for the reading processes. The compatibility also extends to the organization of the data flow from the data bus to the memory cells.

In one preferred development, a controlled writing register device is also provided, which is controlled by the control logic and is coupled to the data inputs/outputs, and a FIFO device is provided, which is clocked by the first clock signal, is coupled to the writing register device and is coupled to the read/write control device. The FIFO device together with the writing register device offer the capability to also write in data to the memory cells, which are organized into organization units, according to the operating modes of the memory module according to the invention.

The memory module according to the invention is advantageously arranged in a standard housing, which is provided for the respective memory generation which is simulated by one of the operating modes. The standard housing is preferably chosen as a function of the configuration data (CFG) for the manufacture of the module. Furthermore, the standard housing has connecting pins, with the appropriate pin wiring, which corresponds to a standard module for the respective memory generation, being simulated by the respective operating mode of the memory module.

It is thus possible to use a standard manufacturing process for memory chips which are used as, for example, SDR or DDR memories, with these devices then being fitted into housing shapes which are predetermined in a standardized manner for the respective desired memory generation. Early manufacturing techniques for the latest memory generation are now used, and the corresponding modules nevertheless appear as a module of the respective old generation for the respective intended application, for example for an older type or generation of personal computer.

Further advantageous refinements and developments of the present invention are the subject matter of the dependent claims, and of the following description of the exemplary embodiments and of the figures.

BRIEF DESCRIPTION OF THE DRAWINGS

The invention will be explained in more detail in the following text using exemplary embodiments and with reference to the figures, in which.

DETAILED DESCRIPTION OF THE INVENTION

Identical and functionally identical elements are provided with the same reference symbols in the figures.

Figure 1:
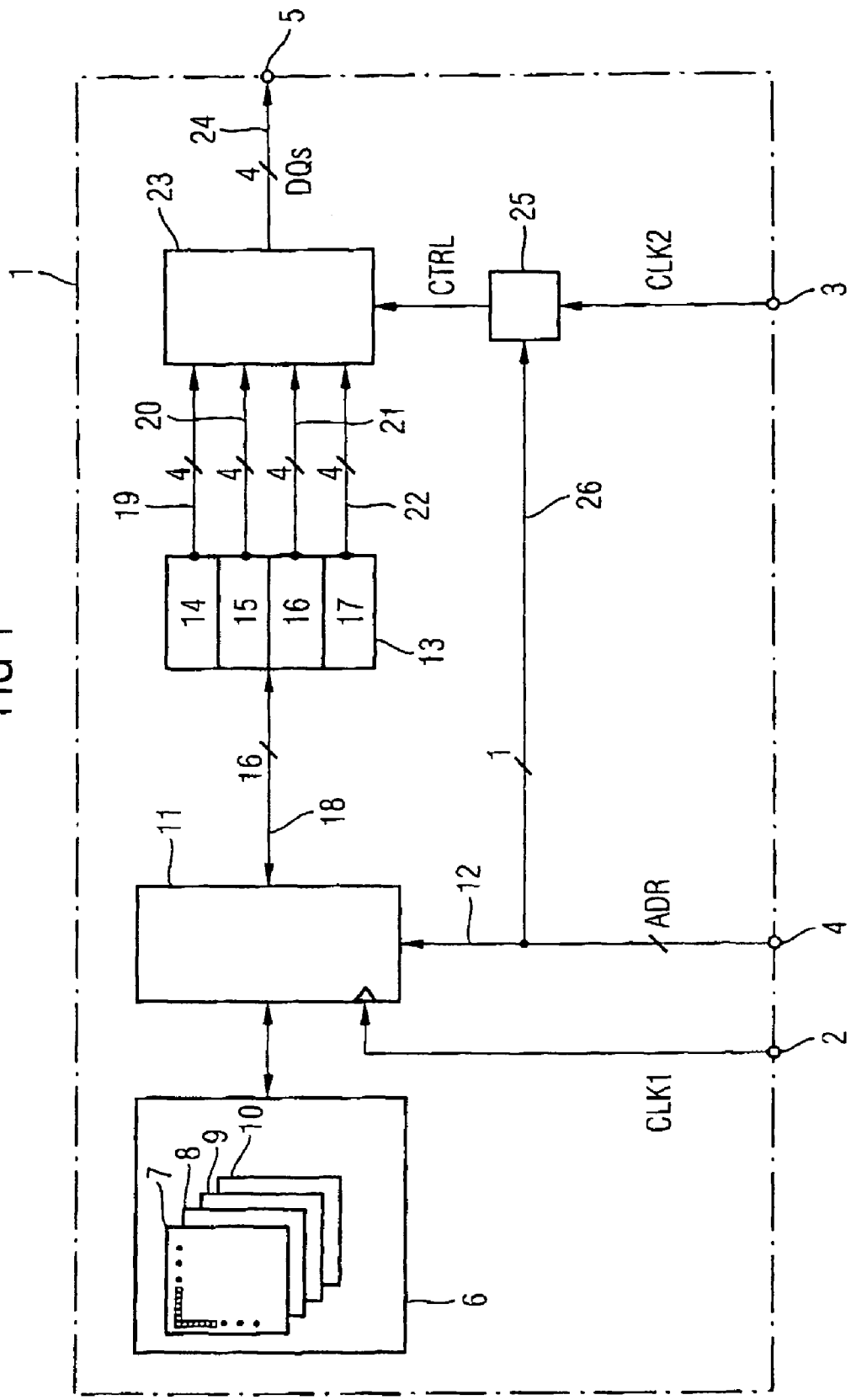
FIG. 1: shows a block diagram of the memory module according to the invention.

FIG. 1 shows a block diagram of the memory module 1 according to the invention.

The memory module 1 has a first clock input 2 for the first clock signal CLK1, a second clock input 3 for the second clock signal CLK2, address inputs 4 for address signals ADR, and data inputs/outputs 5 for memory data DQs.

The memory module 1 according to the invention has a memory cell array 6, which in this case has four memory banks 7, 8, 9, 10 with memory cells, with the corresponding memory cells in this exemplary embodiment being organized in an organization based on groups of four. This means that four memory cells are addressed at the same time by one address. Four bits are thus activated, starting from one initial address.

A clocked read/write control device 11 is provided, which is coupled to the first clock input 2 and is clocked by the first clock signal CLK1. The read/write control device 11 is coupled to the memory cell array 6 with the memory cells. The read/write control device is also coupled via address lines 12 to the address inputs 4 of the memory module 1. The read/write control device 11 is used for driving the individual memory cells and for processing of the corresponding signals by read/write amplifiers to form data signals which can be evaluated, for output into the data inputs/outputs of the module.

Furthermore, a prefetch register unit 13 is provided, which has four prefetch registers 14–17, with each prefetch register 14–17 having a size of 4 bits. The size of the individual prefetch registers 14–17 thus corresponds to the organization of the memory: 4 bits. The number of prefetch registers 14–17 in the prefetch register unit 13 is governed by the desired maximum compatibility of the memory module. Thus SDR SDRAMs generally have only one (prefetch) register, DDR1 SDRAMs have two, and DDR2 SDRAMs require four prefetch registers in order to make it possible to in each case output the amount of data for one organization unit multiplied by the desired data rate (DDR1: twice, DDR2: four times) in comparison to SDR generations, during one clock period of the first clock signal CLK1. The memory module 101 according to the invention described here is thus also suitable for use as a DDR2 module. Accordingly, the prefetch register unit 13 allows the reception of 16 bits of data, which are supplied via 16 data lines 18 from the read/write control device 11 from the memory cell array.

Each prefetch register 14–17 in the prefetch register unit 13 is coupled via in each case four data lines 19–22 to a controlled switching device 23, which in each case couples one of the prefetch registers 14–17 to the data inputs/outputs 5 of the memory module 1. The switching device 23 is coupled to the data inputs/outputs via four data lines 24.

Furthermore, an address/clock switch 25 is provided, to which the second clock signal CLK2 is passed, and to which a data line 26, which corresponds to the least significant bit in the address signals ADR, is supplied. The address clock switch connects one of the incoming signals as a control signal CTRL to the controlled switching device 23. This embodiment of the memory module 1 according to the invention in this case has an organization based on groups of four, so that four memory cells are in each case intended to be applied at the same time, that is to say 4 bits simultaneously, in parallel to the data inputs/outputs 5 for read access.

The memory module 1 according to the invention, as it is illustrated in FIG. 1, allows various operating modes.

In a first operating mode, the memory module operates as a DDR2 memory module. A DDR2 memory module uses a quadruple prefetch, that is to say, starting with the organization unit which is addressed by the address signals, three further, subsequent organization units, in this case 4 bits in each case, that is to say a total of 2 bytes, are read by the read/write control device 11. This is done at the clock rate of the first clock signal CLK1. The first clock signal CLK1 cannot be increased indefinitely in order to achieve a high data rate, owing to the inertia of the memory cells which are used in the memory banks 7–10.

The 16 bits of data are then written directly to the prefetch registers 14–17. In order that these 16 bits can be applied to a data bus that is coupled to the data inputs/outputs 5 by the following clock cycle of the first clock signal CLK1, in order to start a further write or read cycle, the contents of the prefetch registers 14–17 are coupled successively, within one clock period of the first clock signal CLK1, to the data inputs/outputs 5.

In the DDR2 operating mode, the address/clock switch 25 passes on the second clock signal CLK2, whose clock frequency is twice that of the first clock signal CLK1, as the control signal CTRL to the switching device 23. This switches from one prefetch register 14–17 to the next on each falling clock flank and on each rising clock flank. This therefore results in a DDR2 data rate in this operating mode.

In a second operating mode, the memory module 1 according to the invention is compatible with SDR generation memories.

In the second operating mode, the address/clock switch 25 does not pass on the second clock signal CLK2 as the control signal CTRL to the switching device 23, but the least significant bit or the corresponding address signal 26 as the control signal CTRL2 to the switching device. This means that the switching device 23 constantly connects only one of the prefetch registers 14–17 to the data inputs/outputs 5. This is preferably the first prefetch register 14, which stores the four data bits which correspond to the initial address as determined by the address signals ADR. In this SDR operating mode, the memory contents of the other prefetch registers 15, 16, 17 are not used. In fact, this operating mode is compatible with that of an SDR SDRAM memory module. The data rate corresponds to the first clock signal CLK1.

In the third operating mode, the memory module 1 according to the invention operates such that it is compatible with a DDR1 memory module.

In this case, the second clock signal CLK2 is chosen to be identical to the first clock signal CLK1. The address/clock switch 25 thus passes on the clock signal CLK1 or CLK2 as the control signal CTRL to the switching device 23. The switching device 23 switches from one prefetch register 14 to the next 15 on each rising and falling clock flank of the clock signal CLK1 or CLK2. Eight bits are thus read as data DQs to the data inputs/outputs 5 within one clock cycle. A read cycle is thus ended after coupling of half of the prefetch registers that are provided. The date rate and the corresponding format thus correspond to those for DDR1 SDRAM modules.

Figure 2:
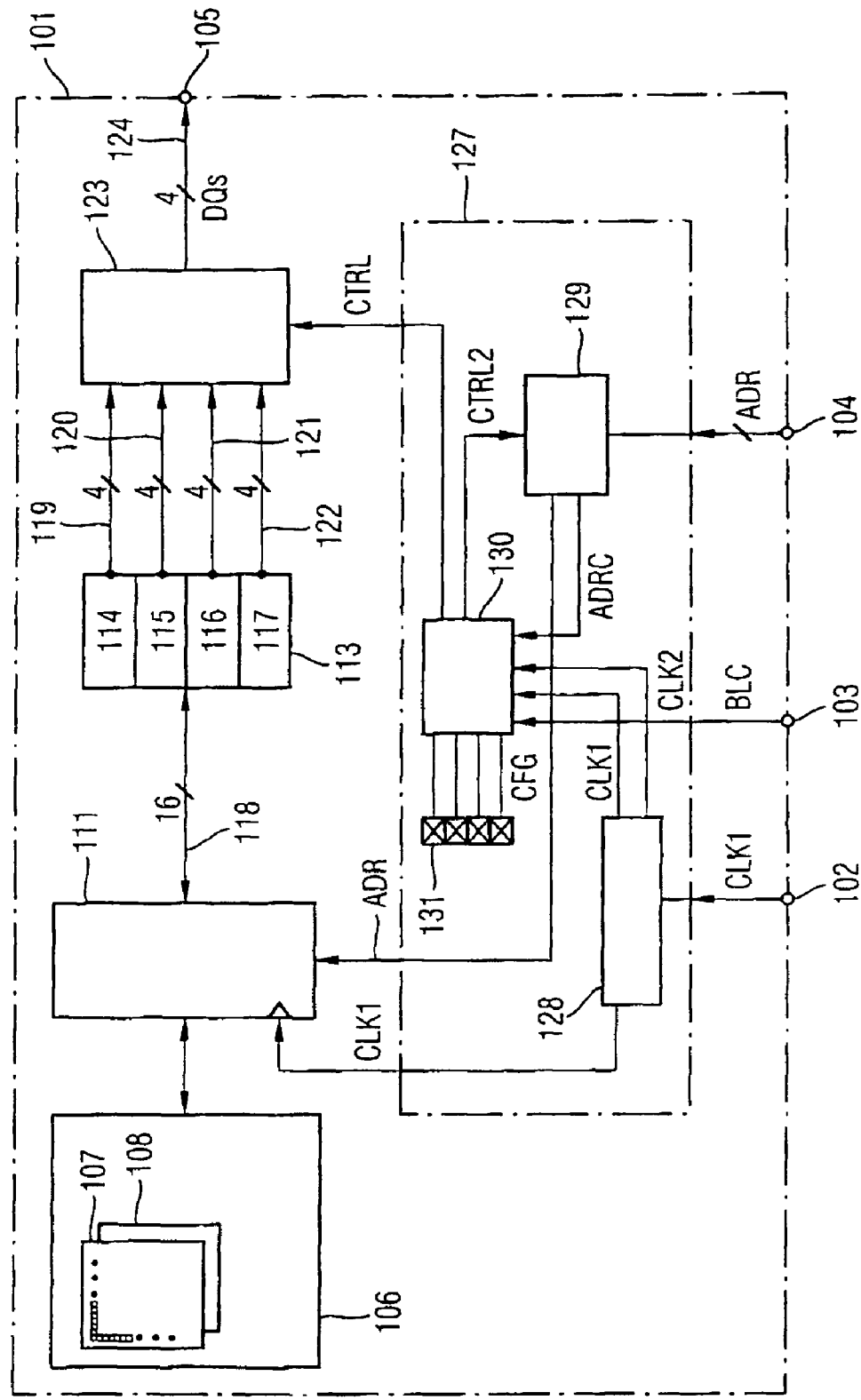
FIG. 2: shows one preferred embodiment of the memory module according to the invention.

FIG. 2 shows one preferred embodiment of the backwards-compatible memory module 101 according to the invention.

The memory module 101 has a clock input 102 for the first clock signal CLK1, a control input 103 for a burst length control signal BLC, address inputs 104 for the address signals ADR, and data inputs/outputs 105 for the data signals DQS.

A memory cell array 106 is provided, which is coupled to the read/write control device 111 that is clocked by the first clock signal CLK1, a prefetch register unit 113 with prefetch registers 114–117, which is coupled via data lines 118 to the read/write control device 111, and a controlled switching device 123 is provided, which is coupled via in each case four data lines 119–122 to the prefetch registers 114–117. In this exemplary embodiment, the memory cell array 106 has two memory banks 107, 108. The organization of the memory is, however, chosen as in the example described above and as shown in FIG. 1 as an organization of groups of four.

The controlled switching device 123 passes the data DQs to the data inputs/outputs 105. Furthermore, control logic 127 is provided, which has a clock generator 128, an address evaluation unit 129 and configuration logic 130.

The configuration logic 130 for the control logic 127 passes the control signal CTRL to the switching device 123. The configuration logic is supplied with the first clock signal CLK1, the second clock signal CLK2, the burst length control signal BLC and an address control signal ADRC.

The clock generator 128 receives the first clock signal CLK1 and uses it to produce the second clock signal CLK2, whose clock frequency is twice that of the first clock signal CLK1. The clock generator 128 passes the first clock signal to the read/write control device 111 and to the configuration logic 130.

The address evaluation unit 129 receives the address signals ADR, and evaluates them. The address signals ADR are also passed on to the read/write control device 111.

The operating mode of this preferred embodiment of the memory module 101 according to the invention is defined by configuration data CFG, which is defined by means of fuse links 131. This configuration data CFG is supplied to the configuration logic 130.

If the configuration data CFG in the fuse links 131 indicates an SDR operating mode, the configuration logic 130 controls the address evaluation unit 129 such that the address signals ADR are passed to the read/write control device 111, and the least significant bit of the address signals ADR is passed as the control signal ADRC to the configuration logic. This one-bit address signal is passed as the control signal CTRL to the switching device 123, which thus just continuously couples the first prefetch register 114 to the data inputs/outputs 105. The second clock signal CLK2 is not used in this operating mode. As has already been stated above with reference to FIG. 1, the memory module then operates as an SDR memory module.

If the configuration data CFG indicates a DDR1 mode, the configuration logic 130 passes the first clock signal CLK1 as the control signal CTRL to the switching device 123 as a result of which, as has already been described above in FIG. 1, only the first two prefetch registers 114, 115 are used in each case. The memory module 101 according to the invention thus operates like a DDR2 memory module. The switching device 123 is then controlled via the first clock signal CLK2, and in each case passes on the prefetch registers 114–117 on each rising and falling clock flank. Only the first two of the prefetch registers 114, 115, which each contain four bits, are coupled to the data inputs/outputs in one access cycle, that is to say per access from the read/write control device 111 to the memory cell array. Even with large burst lengths, which require two or more accesses via the read/write control device 111, only the contents of these first prefetch registers 114, 115 are then used and are passed to the data inputs/outputs 105.

If the configuration data CFG indicates a DDR2 operating mode, the memory module 101 according to the invention operates like a DDR2 memory module. The switching device 123 is then controlled by the second clock signal CLK2, whose clock frequency is twice that of the first clock signal CLK1.

In all of the operating modes, the burst length can be varied by the configuration logic 130 by means of the burst length control signal BLC. For example, in the DDR1 operating mode, the burst length can be set to four, that is to say the prefetch registers 114, 115 are coupled to the data inputs/outputs 105 by means of the switching device 123 twice successively in two successive clock cycles. Data is transmitted to the data inputs/outputs 105 at four successive switching time references—in each case one clock flank. In the organization based on groups of four as described here by way of example, this then corresponds to a data element of 16 bits, which are passed to the data inputs/outputs 105 in one burst.

Figure 3:
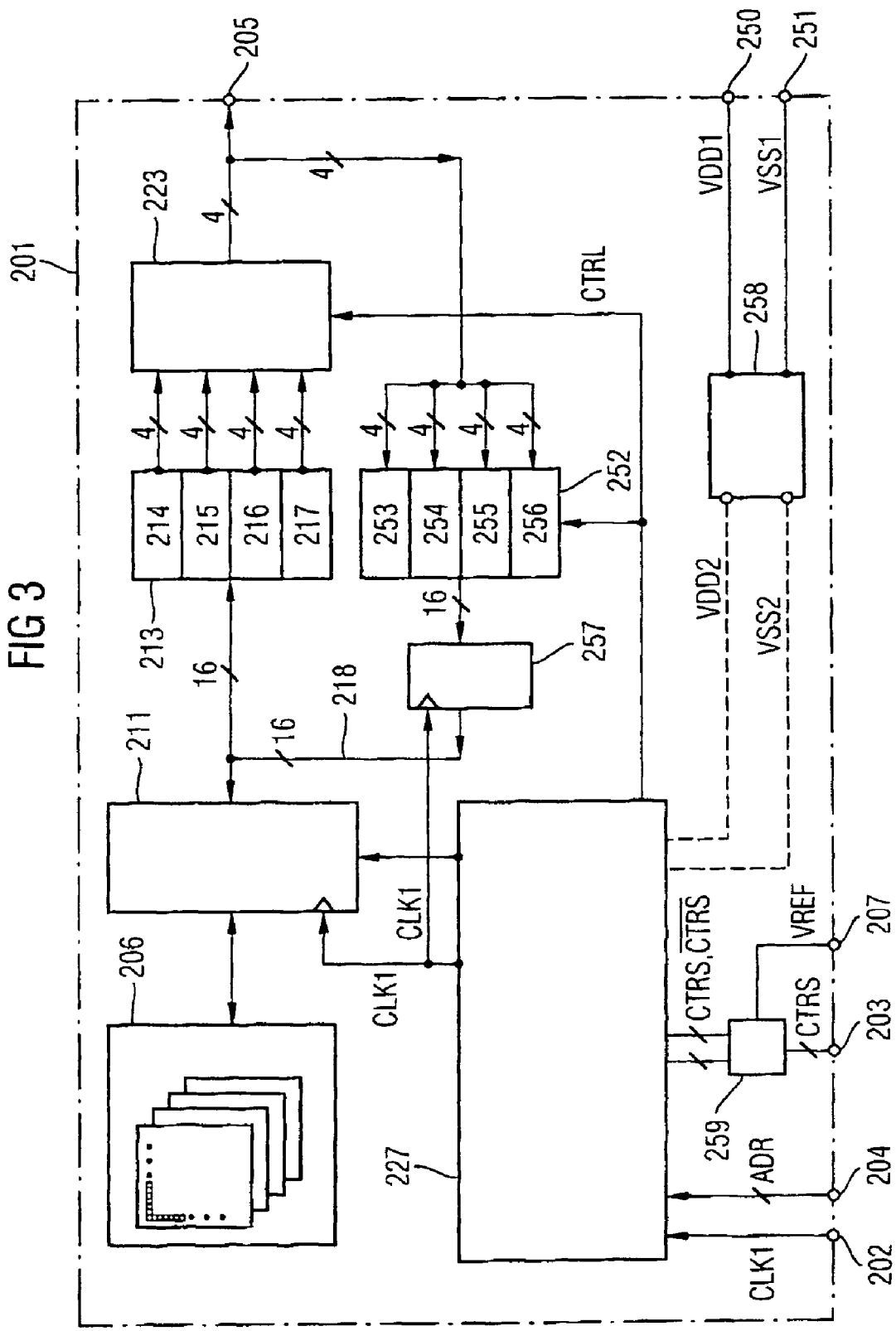
FIG. 3: shows a preferred development of the memory module according to the invention.

FIG. 3 shows a development of the backwards-compatible memory module 201 according to the invention.

The development 201 of the memory module essentially has the same elements as those shown in FIG. 2. A clock input 202, address inputs 204, data inputs/outputs 205, a memory cell array 206, a read/write control device 211, a prefetch register unit 213, a controlled switching device 123 and control logic 227 are provided. Furthermore, the development of the memory module 201 according to the invention has a reference voltage connection 205 for application of a reference voltage VREF, control connections 203 for application of single-ended control signals CTRs, a first and a second supply voltage connection, 250, 251 for connection of a first and a second supply voltage VDD1, VSS1.

A writing register unit 252 is provided, which is coupled via data lines with a width of 4 bits to the data inputs/outputs 205 and has four writing registers 253–256. The writing registers 253–256 are of the same size as the prefetch registers 214–217 in the prefetch register unit 213. The writing register unit 252 is coupled via data lines to a FIFO device 257, which is clocked by the first clock signal CLK1.

The FIFO device 257 is coupled via data lines 218 to the read/write control device 211. The additionally provided FIFO device 257 and the writing register device 252 allow, analogously to the prefetch registers 214–217 and the controlled switching device 223, data which is on the data bus or at the data inputs/outputs 205 to be written to the memory cells in accordance with the operating modes.

The control logic 227 controls the switching device 223 and the writing register device 252 using the same control signals CTRL.

The control signals CTRs are used to determine whether a write or a read access is being made to the memory cells in the memory cell array 206. These single-ended control signals CTRs which are applied to the control inputs 203 are converted in a signal converter 259 (to which the reference voltage VREF is also supplied) to differential control signals CTRs, CTRs', and are supplied to the control logic 227. This has the advantage that, in the case of the memory module 201 according to the invention, it is very largely possible to make use of existing memory module designs, which describe DDR2 memory modules. Essentially, differential control signals are required in the DDR2 standard. However, in order to allow the memory module 208 according to the invention to also be used in a DDR1 or SDR environment, the single-ended control signals which are present there must first of all be converted to differential signals. In this case, this is done via the signal converter 257.

Since the supply voltages for DDR1, SDR and DDR2 also differ, a voltage regulator 258 is provided, which converts the first and the second supply voltage VDD1, VSS1 to a supply voltage VDD2, VSS2 which is suitable for DDR2 architectures. FIG. 3 shows, just schematically and by means of dotted lines, the internal voltage supply for the control logic, which can advantageously be based on DDR2 control logic.

Figure 4:
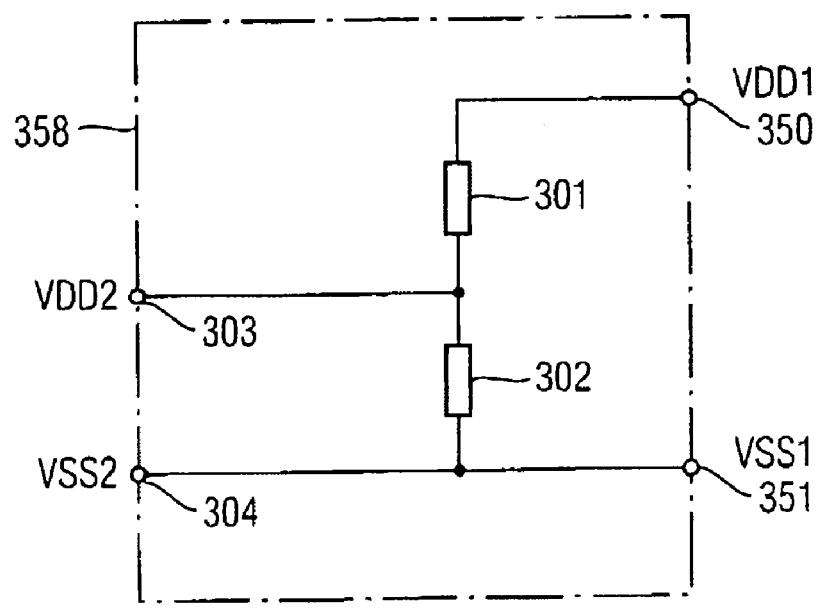
FIG. 4: shows a voltage regulation for use in the memory module according to the invention.

FIG. 4 shows an example of a voltage regulator 358 with a voltage divider formed by two resistors 301, 302. External supply voltages VDD1, VSS1 are applied to the supply voltage connections 350, 351, with the two resistors 301, 302 being connected in series between the supply voltage connections 350, 351. A first internal supply voltage VDD2 can be tapped off between the resistors 301, 302 and is coupled to one output 303 of the voltage regulator 358. The voltage level of the second external supply voltage VSS1 is passed to a second output 304.

Figure 5:
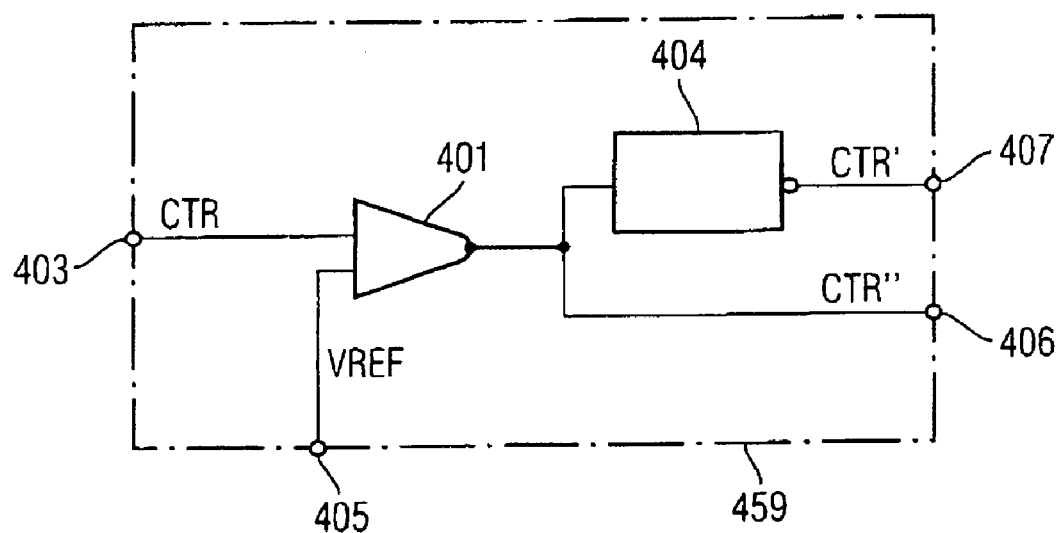
FIG. 5: shows a signal converter for use in the memory module according to the invention.

FIG. 5 shows an example of the signal converter 457 for conversion of a single-ended control signal CTR to a differential control signal CTR', CTR". A comparator 401 is provided, which compares the single-ended control signal CTR (which is input via an input 403) with a reference voltage VREF (which is input via a reference voltage input 405), and outputs the comparison result to an inverter 404, and to a first signal output 406 of a differential output pair 406, 407. The output signal from the inverter 404 is coupled to the second output 407, as a complementary control signal CTR'.

Although the present invention has been explained with reference to preferred embodiments, it is not restricted to them but can be modified in many ways.

In particular, the memory module according to the invention need not be designed with a memory cell array which is organized into organization units based on groups of four. Other organization forms, for example 8, 16 or 32, are also feasible, so that an appropriate number of data lines and inputs/outputs must be kept available. The storage of configuration data in fuse links can likewise be modified, and it is possible, for example, to use non-volatile memories for storing configuration data.

The number of memory banks illustrated in the exemplary embodiments should be regarded as being only an example. Memories with further memory banks are, of course, feasible.

Although reading processes have mainly been described with reference to the exemplary embodiments, the prefetch registers, which are advantageously in the form of bidirectional registers, and their control according to the invention are, of course, likewise suitable for writing data from the data inputs/outputs to the memory cell array, with the signal paths from the data inputs/outputs in each case running via the switching device and the prefetch register unit to the read/write control device.

Although the invention has been explained in more detail with reference to SDR, DDR1, DDR2 memory modules and their specifications, it is not restricted to module types such as these. The idea according to the invention of backwards compatibility by means of the measures according to the invention, as they are formulated in the claims can, of course, also be applied to future generations of memory modules in order to achieve backwards compatibility.

The present invention thus provides a backwards-compatible memory module which can be used in particular as an SDR, DDR1, DDR2 and/or DDR3 SDRAM module. The measures according to the invention for prefetch register control, the supply voltage matching and the conversion of simple control signals to differential control signals allow the memory module according to the invention to be used in computer environments which were originally designed for older memory generations.

LIST OF REFERENCE SYMBOLS

1 Backwards-compatible memory module
2, 3 Clock input
4 Address input
5 Data inputs/outputs
6 Memory cell array
7, 8, 9, 10 Memory banks
11 Read/write control device
12 Address line
13 Prefetch register unit
14–17 Prefetch register
18–22 Data line
23 Controlled switching device
24 Data line
CLK1 Clock signal
CLK2 Clock signal
ADR Address signals
DQS Data signals
25 Address clock switch
LSB Address signal
101 Memory module
102 Clock input
103 Control input
104 Address input
105 Data inputs/outputs
106 Memory cell array
107 Memory bank
108 Memory bank
111 Read/write control device
113 Prefetch register unit
114–117 Prefetch register
118–122 Data lines
123 Switching devices
124 Data line
DQs Data
CTRL Control signal
ADR Address signals
ADRC Address control signal
CTRL2 Control signal
127 Control logic
128 Clock generator
129 Address evaluation unit
130 Configuration logic
CFG Configuration data
131 Fuse link
201 Memory module
202 Clock input
203 Control inputs
204 Address inputs
205 Data inputs/outputs
206 Memory cell array
207 Reference voltage connection
211 Read/write control device
212 Prefetch register unit
214-217 Prefetch register
218 Data line
223 Switching device
250, 251 Supply voltage connection
252 Writing register device
253–256 Writing register
258 Voltage regulator
VDD1, VSS1 Supply voltages
VDD2, VSS2 Supply voltages
257 FIFO device
259 Signal converter
301, 302 Resistor
303, 304 Supply voltage connection
350, 351 Supply voltage connection
358 Voltage regulator
401 Comparator
403 Signal input
404 Inverter
405 Reference voltage connection
406, 407 Output

What is claimed is:

1. Memory module having:
   (a) at least one memory cell array, the memory cells each being addressable by at least one address and being organized in organization units comprising a predetermined number of memory cells which are jointly contemporaneously accessible;
   (b) a clocked read/write control device, which is clocked with a first clock signal and which is coupled to the memory cell array, for writing data to and reading data from the memory cells as a function of address signals;
   (c) a prefetch register unit, which is coupled to the read/write control device, for initial storage of data which is read from the memory cell array, the prefetch register unit having a plurality of prefetch registers, whose respective register size corresponds to the predetermined number of memory cells in the organization units; and
   (d) a controlled switching device, which is coupled to the prefetch register unit, for outputting the data which is initially stored in the prefetch registers at data input/output terminals of the memory module, wherein the switching device, in a first operating mode, is controlled by a second clock signal and successively couples the prefetch register to the data input/output terminals of the memory module, the number of said data input/output terminals corresponding to the predetermined number of memory cells in the organization units, and wherein the switching device, in a second operating mode, is controlled by at least one of the address signals and couples at least one of the prefetch registers to the data input/output terminals of the memory module.

2. Memory module according to claim 1, wherein the switching device, in a third operating mode of the memory module, is controlled by at least one of the address signals and by the first clock signal and successively couples at least a selection of the prefetch registers to the data input/output terminals of the memory module.

3. Memory module according to claim 2, wherein, in the third operating mode, the switching device in each case successively couples a first prefetch register and further prefetch registers to the data input/output terminals of the memory module at a switching time reference, with the first prefetch register containing, in an initially stored form, the data for those memory cells in the respective organization unit which are addressed by an initial address, with the initial address being determined by the address signals, and with the number of further prefetch registers which are coupled to the data input/output terminals being dependent on the burst length.

4. Memory module according to claim 3, wherein the switching time reference is every alternate rising clock flank of the second clock signal.

5. Memory module according to claim 3, wherein the switching time reference is every alternate falling clock flank of the second clock signal.

6. Memory module according to claim 3, wherein the switching time reference is every alternate zero crossing of the differential first or second clock signal.

7. Memory module according to claim 3, wherein the switching time reference is every rising clock flank of the first clock signal.

8. Memory module according to claim 3, wherein a read cycle is ended after half the number of prefetch registers have been coupled.

9. Memory module according to claim 3, wherein the first and the further prefetch registers which are coupled to the data input/output terminals correspond to a cohesive address block.

10. Memory module according to claim 2, wherein the memory module operates as a DDR1-SDRAM module in the third operating mode.

11. Memory module according to claim 1, wherein a clock frequency of the second clock signal is an integer multiple of the clock frequency of the first clock signal.

12. Memory module according to claim 1, wherein the first clock signal and the second clock signal are at the same clock frequency.

13. Memory module according to claim 1, wherein the clock signals are differential clock signals.

14. Memory module according to claim 13, wherein the controlled switching device, in the first operating mode of the memory module, changes the respective prefetch register which is coupled to the data input/output terminals on each zero crossing of the second differential clock signal.

15. Memory module according to claim 1, wherein the first clock signal is an externally applied clock signal.

16. Memory module according to claim 1, wherein the controlled switching device, in the first operating mode of the memory module, changes the respective prefetch register on each rising and each falling clock flank of the second clock signal.

17. Memory module according to claim 1, wherein the controlled switching device, in the first operating mode of the memory module, changes the prefetch register either only on each rising or only on each falling clock flank of the second clock signal.

18. Memory module according to claim 1, wherein the memory module has control logic, which is coupled at least to the read/write control device and to the switching device and controls the burst length of the data which is tapped off at the data input/output terminals of the memory module as a function of at least one burst length control signal.

19. Memory module according to claim 18, wherein the control logic has at least one clock generator for generating a clock signal which is complementary to the first clock signal, and for generating the second clock signal.

20. Memory module according to claim 18, wherein the control logic has an address evaluation unit for selection of the address signals for controlling the switching device.

21. Memory module according to claim 18, wherein a writing register device is provided, which is controlled by the control logic and is coupled to the data input/output terminals, and a FIFO device is provided, which is clocked by the first clock signal, is coupled to the writing register device and is coupled to the read/write control device.

22. Memory module according to claim 1, wherein, in the second operating mode, the switching device couples that prefetch register to the data input/output terminals of the memory module which contains, in an initially stored form, the data for those memory cells in the respective organization unit which are addressed by an initial address, with the initial address being determined by the address signals.

23. Memory module according to claim 1, wherein the operating mode and/or the burst length is adjusted as a function of memory configuration data.

24. Memory module according to claim 23, wherein the memory configuration data is defined by means of fuse links in the memory module during its manufacture.

25. Memory module according to claim 1, wherein the memory module has supply voltage connections for application of an external supply voltage and has voltage regulation means for controlling the external supply voltage at an internal supply voltage for the memory cell arrays, a read/write control device, a prefetch register unit, a switching device, and/or control logic.

26. Memory module according to claim 25, wherein the voltage regulation means has a voltage divider.

27. Memory module according to claim 25, wherein the voltage regulation is activated as a function of the memory configuration data.

28. Memory module according to claim 1, wherein the memory module operates as a DDR2-SDRAM module in the first operating mode.

29. Memory module according to claim 1, wherein the memory module operates as a SDR-SDRAM module in the second operating mode.

30. Memory module according to claim 1, wherein a reference voltage terminal is provided for applying a reference voltage signal.

31. Memory module according to claim 1, wherein a signal converter is provided for generating a differential control signal from an external single-ended control signal and the reference voltage signal.

32. Memory module according to claim 31, wherein the signal converter has a comparator and an inverter.

33. Memory module according to claim 31, wherein the external single-ended control signal is a data strobe signal.

34. Memory module according to claim 1, wherein the prefetch registers are implemented as bidirectional registers.

35. Memory module according to claim 1, wherein the memory module is arranged in a standard housing, which is provided for the respective memory generation which is simulated by one of the operating modes.

36. Memory module according to one of claims 23 and 35, wherein the standard housing is chosen as a function of the configuration data during the manufacture of the module.

37. Memory module according to claim 35, wherein the standard housing has connecting pins and the corresponding pin wiring, which corresponds to a standard module of the respective memory generation which is simulated by the respective operating mode of the memory module.

* * * * *